(12) United States Patent
Yamada et al.

(10) Patent No.: US 9,888,611 B2
(45) Date of Patent: Feb. 6, 2018

(54) POWER SEMICONDUCTOR MODULE

(71) Applicant: FUJI ELECTRIC CO., LTD., Kawasaki-shi, Kanagawa (JP)

(72) Inventors: Takafumi Yamada, Matsumoto (JP); Hiromichi Gohara, Matsumoto (JP); Yoshitaka Nishimura, Azumino (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/851,868

(22) Filed: Sep. 11, 2015

(65) Prior Publication Data

US 2015/0382506 A1    Dec. 31, 2015

Related U.S. Application Data

(63) Continuation of application No. PCT/JP2014/070538, filed on Aug. 5, 2014.

(30) Foreign Application Priority Data

Sep. 5, 2013    (JP) .................................. 2013-183694

(51) Int. Cl.
   *H05K 7/20*    (2006.01)
   *H01L 23/473*    (2006.01)
   (Continued)

(52) U.S. Cl.
   CPC ..... *H05K 7/20263* (2013.01); *H01L 21/4871* (2013.01); *H01L 23/24* (2013.01);
   (Continued)

(58) Field of Classification Search
   CPC ............. H05K 7/20263; H05K 1/0203; H05K 2201/066; H05K 7/20854; H05K 7/205; H01L 23/488; H01L 21/4871
   See application file for complete search history.

(56) References Cited

U.S. PATENT DOCUMENTS 5,504,378 A * 4/1996 Lindberg .............. H02M 7/003
                                                        257/678
7,961,474 B2    6/2011 Yoshida et al.
(Continued)

FOREIGN PATENT DOCUMENTS

CN    101794741 A    8/2010
CN    102714929 A    10/2012
(Continued)

OTHER PUBLICATIONS

PCT, "International Search Report for International Application No. PCT/JP2014/070538".
(Continued)

*Primary Examiner* — James Wu
*Assistant Examiner* — Michael Matey
(74) *Attorney, Agent, or Firm* — Manabu Kanesaka

(57) ABSTRACT

A power semiconductor module includes an insulated wiring board; semiconductor elements mounted on one main surface of the insulated wiring board; a heat radiation board bonded to another main surface of the insulated wiring board; a plurality of fins including a first group of fins each having one end fixed to the another main surface of the heat radiation board and another end with a free end; and a water jacket housing the plurality of fins and allowing coolant to flow among the plurality of fins. The plurality of fins further includes a second group of fins as reinforced fins each having one end fixed to the another main surface of the heat radiation board and another end bonded to the water jacket.

5 Claims, 5 Drawing Sheets

(51) Int. Cl.

| | | |
|---|---|---|
| *H01L 23/373* | (2006.01) | |
| *H01L 23/24* | (2006.01) | |
| *H01L 21/48* | (2006.01) | |
| H01L 23/00 | (2006.01) | |
| H01L 25/07 | (2006.01) | |
| H01L 25/18 | (2006.01) | |
| H01L 23/488 | (2006.01) | |

(52) U.S. Cl.
CPC ........ *H01L 23/3735* (2013.01); *H01L 23/473* (2013.01); *H01L 23/562* (2013.01); *H05K 7/205* (2013.01); *H05K 7/20927* (2013.01); H01L 23/488 (2013.01); H01L 24/32 (2013.01); H01L 24/48 (2013.01); H01L 24/73 (2013.01); H01L 25/072 (2013.01); H01L 25/18 (2013.01); H01L 2224/291 (2013.01); H01L 2224/32225 (2013.01); H01L 2224/48091 (2013.01); H01L 2224/48227 (2013.01); H01L 2224/73265 (2013.01); H01L 2924/00014 (2013.01); H01L 2924/01322 (2013.01); H01L 2924/1305 (2013.01); H01L 2924/13055 (2013.01); H01L 2924/181 (2013.01); H01L 2924/3511 (2013.01); H01L 2924/3512 (2013.01)

(56) References Cited

U.S. PATENT DOCUMENTS

| | | | |
|---|---|---|---|
| 8,927,873 B2 | 1/2015 | Hori et al. | |
| 9,472,488 B2* | 10/2016 | Gohara | H01L 23/473 |
| 2008/0237847 A1* | 10/2008 | Nakanishi | H01L 23/473 257/722 |
| 2010/0170221 A1* | 7/2010 | Yoshida | F02K 3/075 60/226.3 |
| 2010/0172091 A1* | 7/2010 | Nishiura | H01L 23/3735 361/689 |
| 2010/0172104 A1* | 7/2010 | Yoshida | F28F 1/126 361/717 |
| 2010/0193941 A1 | 8/2010 | Mori et al. | |
| 2012/0018741 A1* | 1/2012 | Sato | H02M 7/003 257/77 |
| 2012/0033381 A1 | 2/2012 | Matsumoto et al. | |
| 2012/0139096 A1* | 6/2012 | Gohara | H01L 23/3735 257/706 |
| 2012/0279761 A1 | 11/2012 | Hori et al. | |
| 2013/0134572 A1* | 5/2013 | Lenniger | H01L 23/367 257/690 |
| 2013/0264702 A1* | 10/2013 | Nishi | H01L 23/36 257/712 |
| 2014/0043765 A1* | 2/2014 | Gohara | H01L 23/3735 361/699 |
| 2014/0138075 A1* | 5/2014 | Yang | H01L 23/3735 165/185 |
| 2014/0196871 A1* | 7/2014 | Otsuka | H05K 7/20236 165/104.33 |
| 2014/0252590 A1* | 9/2014 | Gohara | H01L 23/3735 257/715 |
| 2015/0008574 A1* | 1/2015 | Gohara | H01L 23/473 257/714 |
| 2016/0129792 A1* | 5/2016 | Gohara | B23P 15/26 310/54 |
| 2016/0190038 A1* | 6/2016 | Koyama | H05K 7/20927 257/693 |
| 2016/0343641 A1* | 11/2016 | Hori | H01L 23/473 |
| 2017/0271240 A1* | 9/2017 | Inoue | H01L 23/473 |

FOREIGN PATENT DOCUMENTS

| | | |
|---|---|---|
| JP | H09-162335 A | 6/1997 |
| JP | 2007-036094 A | 2/2007 |
| JP | 2007-173301 A | 7/2007 |
| JP | 2008-270297 A | 11/2008 |
| JP | 2010-093020 A | 4/2010 |
| JP | 2010-161203 A | 7/2010 |
| JP | 2010-182831 A | 8/2010 |
| JP | 2012-151328 A | 8/2012 |
| WO | 2011/021384 A1 | 2/2011 |
| WO | 2011/087028 A1 | 7/2011 |

OTHER PUBLICATIONS

China Patent Office, "Office Action for Chinese Patent Application No. 201480013718.2," dated Mar. 30, 2017.

* cited by examiner

POWER SEMICONDUCTOR MODULE

CROSS-REFERENCES TO RELATED APPLICATIONS

The present application is a Continuation Application of PCT International Application No. PCT/JP2014/070538 filed Aug. 5, 2014, and claiming priority from Japanese Application No. 2013-183694 filed Sep. 5, 2013, the disclosure of which is incorporated herein.

TECHNICAL FIELD

The present invention relates to a power semiconductor module that is used for a semiconductor device to control heavy current and high voltage.

BACKGROUND ART

For an apparatus that uses a motor, as in a hybrid vehicle and an electric vehicle, a power converter is used to save energy. For the power converter, a power semiconductor module that includes power semiconductor elements, such as IGBT (Insulated Gate Bipolar Transistor), is widely used. The power semiconductor elements heat up when controlling heavy current, hence in order to cool the power semiconductor elements, a water cooling type power semiconductor module structure, in which a plurality of fins is integrated into a heat radiation board, is used.

Such a power semiconductor module has, for example, an insulated wiring board which includes: a ceramic board having an insulate thin plate; a metal circuit wiring layer which is directly bonded or brazed to one surface of the board; and a metal layer which is directly bonded or brazed almost to the entire surface of the other side. Electric semiconductor elements are soldered to a part of the surface of the metal circuit wiring layer, and a heat radiation board is soldered to the metal layer formed on the rear surface of the insulated wiring board. Further, a known power semiconductor module has a structure that includes, on the opposite side (lower side surface) of the heat radiation board: a plurality of fins which is integrated and bonded at predetermined intervals; and a container that surrounds all the fins with an opening which allows cooling water to easily flow through the spaces formed among the plurality of fins (Patent Document 1). The power semiconductor module has a structure where a separate heat radiation board for holding the fins is not inserted, or a structure where heat radiation grease does not exist between the heat radiation board and the fins. In other words, the insulated wiring board that mounts the semiconductor elements is directly bonded to the heat radiation board, which is integrated with the fins, whereby the thermal resistance from the semiconductor elements to the heat radiation board is decreased, and heat radiation and reliability of the product are improved. For this, a heat radiation board is formed from a material of which main component is aluminum or copper.

Other documents disclose techniques regarding a semiconductor element cooling radiator which reduces stress due to the thermal expansion difference among members forming the semiconductor module, and miniaturizes and simplifies the semiconductor module by decreasing a number of components (Patent Documents 2, 3).

Another document discloses a technique regarding a semiconductor device where the warpage of the heat sink is suppressed, and a warpage suppression plate can be easily brazed to the heat sink (Patent Document 4).

Patent Document 1: Japanese Patent Application Publication No. 2007-36094
Patent Document 2: Japanese Patent Application Publication No. 2007-173301
Patent Document 3: Japanese Patent Application Publication No. 2008-270297
Patent Document 4: Japanese Patent Application Publication No. 2010-182831

DISCLOSURE OF THE INVENTION

In the power semiconductor module which includes a fin base where the heat radiation board and the fins are integrated, the linear expansion coefficient of a ceramics board, which is an insulated thin plate forming the insulated wiring board, is normally about $3 \times 10^{-6}/°$ C. to $8 \times 10^{-6}/°$ C. The linear expansion coefficient of the heat radiation board forming the fin base is about $23 \times 10^{-6}/°$ C. in the case of aluminum, and about $17 \times 10^{-6}/°$ C. in the case of copper, both of which are greater than that of the insulated thin plate. This difference of the linear expansion coefficients generates thermal stress during thermal cycling, and this thermal stress may cause cracking in the solder layer, which is disposed between the metal layer of the insulated wiring board and the heat radiation board of the fin base, so as to bond the metal layer and the heat radiation board, and a breakdown may be generated as a result.

Recently, demands for miniaturization and higher heat resistance have become more pronounced for power semiconductor modules. A way of responding to these demands is to decrease the thickness of the heat radiation board that is integrated with the fins. This is because the thermal resistance can be decreased and the temperature Tj of the semiconductor elements of the power semiconductor module can be dropped if the heat radiation board is thinner. However, if the heat radiation board is thinner, the heat radiation board is more easily deformed, and the warpage of the entire module tends to increase. If the warpage increases, cracking is more easily generated in the solder layer that bonds the insulated wiring board and the heat radiation board.

With the foregoing in view, it is an object of the present invention to provide a power semiconductor module in which the warpage of the entire module can be suppressed, even if the thickness of the heat radiation board that is bonded under the insulated wiring board is decreased, and cracking is hardly generated in the solder layer that bonds the insulated wiring board and the heat radiation board.

To solve the above problems and to achieve the object, the present invention provides a power semiconductor module including: an insulated wiring board; semiconductor elements mounted on one of principal surfaces of the insulated wiring board; a heat radiation board that is bonded to the other of principal surfaces of the insulated wiring board; a plurality of fins each having one end fixed to the other of principal surfaces of the heat radiation board and the other end of which is a free end; and a water jacket that houses the plurality of fins and allows coolant to flow among the fins, wherein at least some of the plurality of fins are formed as reinforced fins by the other ends thereof being bonded to the water jacket.

It is preferable that the insulated wiring board includes: an insulated thin plate; a metal circuit wiring layer that is bonded to one of principal surfaces of the insulated thin plate; and a metal layer that is bonded to the other of principal surfaces of the insulated thin plate.

Further, it is preferable that the reinforced fins include fins located below the insulated wiring board at positions where ratio B/A is 20% or less, wherein reference A denotes a length of one side of the insulated wiring board, and reference B denotes a distance from an edge of the insulated wiring board to the reinforced fin.

Furthermore, it is preferable that the reinforced fins include at least a pair of fins located below the insulated wiring board at positions inward from mutually opposite sides of the insulated wiring board by the distance B.

It is preferable that the other ends of the reinforced fins each include an area bonded to the water jacket and a free end area.

The present invention can provide a power semiconductor module in which the warpage of the entire module can be suppressed, even if the thickness of the heat radiation board bonded under the insulated wiring board is decreased, and cracking is hardly generated in the solder layer that bonds the insulated wiring board and the heat radiation board.

BEST MODE FOR CARRYING OUT THE INVENTION

Figure 1:
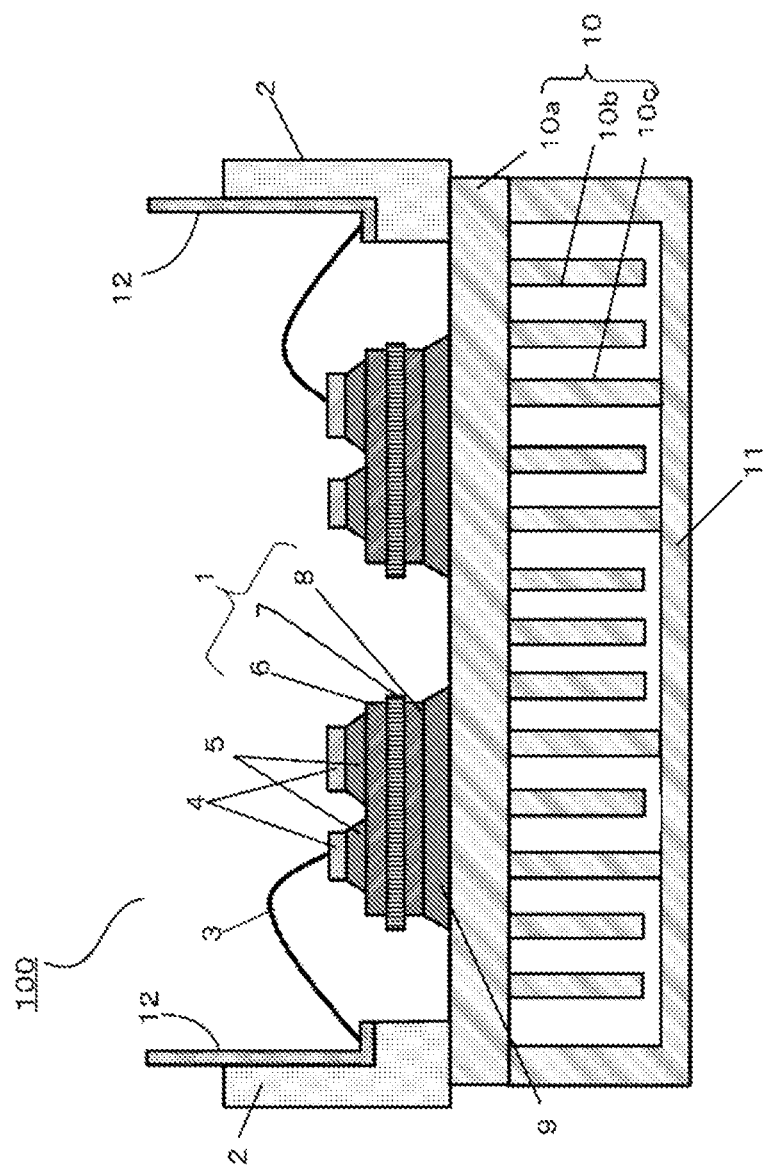
FIG. 1 is a schematic cross-sectional view of a power semiconductor module according to an embodiment of the present invention.

Embodiments of the power semiconductor module of the present invention will now be described with reference to the drawings. In the following description of the embodiments and the accompanying drawings, a same composing element is denoted with a same reference symbol, and redundant description is omitted. In the accompanying drawings described in the examples, the scale and dimensional ratios are not precise to make the drawings easier to view and to make the understanding of the invention easier. The present invention is not limited to the embodiments herein below, as long as the content does not depart from the true spirit thereof.

General technical ideas or concepts of an embodiment of the power semiconductor module of the present invention will be described first with reference to the drawings. In the power semiconductor module 100 according to an embodiment of the present invention that is depicted in the cross-sectional view in FIG. 1, only four semiconductor elements 4 are illustrated, but the power semiconductor module 100 may be formed as a three-phase inverter circuit that includes six IGBTs and six free wheeling diodes (FWDs), for example.

The insulated wiring board 1 includes an insulated thin plate 7, a metal circuit wiring layer 6 and a metal layer 8. The metal circuit wiring layer 6 is disposed on the front surface of the insulated thin plate 7. The metal layer 8 is disposed on the rear surface of the insulated thin plate 7. Semiconductor elements 4 are bonded to the metal circuit wiring layer 6 via a solder layer 5.

Each semiconductor element 4 has a top electrode (not illustrated) on the top thereof, and is electrically connected to a lead out electrode terminal 12 from the top electride via the bonding wire 3. Instead of the lead out electrode terminal 12, the bonding wire 3 may be connected to an appropriate location of the metal circuit wiring layer 6.

A fin base 10 includes a heat radiation board 10a, and fins 10b and reinforced fins 10c each having one end bonded to the bottom surface of the heat radiation board 10a. A water jacket 11 is bonded to the heat radiation board 10a so as to cover the fins 10b and the reinforced fins 10c. The metal layer 8 is bonded to the surface of the heat radiation board 10a via a solder layer 9.

It is preferable that the insulated wiring board 1, soldered to the surface of the heat radiation board 10a of the fin base 10 and the semiconductor elements 4 are enclosed by a resin case 2, that has a height greater than the height of the semiconductor elements 4. The space created by the resin case 2 (side faces) and the fin base 10 (bottom face) is filled with resin (not illustrated) which is poured in, or covered by a resin cover (not illustrated). The space may be both filled with resin and covered by the resin cover. As a result, the semiconductor elements 4 inside can be protected from the outer environment and mechanical stress applied from the outside.

The insulated wiring board 1 is a known component, and includes, for example, an insulated thin plate 7 (e.g. ceramic board), a thin metal circuit wiring layer 6 that is directly bonded or brazed to the front surface of the insulated thin plate 7, and a metal layer 8 that is bonded to the rear surface of the insulated thin plate 7. For the insulated thin plate 7 of the insulated wiring board 1, a ceramic board of which raw material is aluminum nitride, aluminum oxide, silicon nitride or the like can be used. The metal circuit wiring layer 6 and the metal layer 8, forming the insulated wiring board 1, are directly bonded or brazed to the insulated thin plate 7 using a metal foil having good conductivity, such as copper or aluminum.

In the structure illustrated in FIG. 1, two semiconductor elements 4 are bonded to the insulated wiring board 1, but the power semiconductor module 100 of the present invention is not limited to the case in which a number of semiconductor elements 4 bonded to the insulated wiring board 1 is two, but the number of semiconductor elements 4 may be one or three or more.

The power semiconductor module 100 in FIG. 1 includes two insulated wiring boards 1 on which two semiconductor elements 4 are bonded, but the power semiconductor module 100 of the present invention is not limited to the structure where a number of insulated wiring boards 1 is two. The number of insulated wiring boards 1 can be appropriately changed in accordance with the external circuit, to which the power semiconductor module 100 is connected, and the intended use or functions of the power semiconductor module 100.

If the insulated wiring board 1, on which the semiconductor elements 4 are mounted, is bonded between the metal layer 8 on the bottom surface of the insulated wiring board 1 and the fin base 10 via the solder layer 9, then the thermal resistance between the semiconductor elements 4 and the fin base 10 can be kept low.

For the fins 10b and the reinforced fins 10c, blade fins, corrugated fins or pin fins, for example, are used. The blade fins are a plurality of blade-shaped fins which is bonded to the heat radiation board 10a in parallel with one another at a predetermined interval. The corrugated fins include one plate that is cyclically folded at a predetermined distance interval, and bonded to the heat radiation board 10a. The pin fins are a plurality of cylindrical- or prismatic-shaped pins which is bonded to the heat radiation board 10a to form an array with predetermined spacing. The forms of the fins are not limited to the blade fins, corrugated fins and pin fins, but can have varied and different forms. However fins having a shape with which pressure loss, with respect to the flow of coolant, is small, is preferable since the fins become resistant to flow when the coolant flows through the spaces between the fins.

As mentioned above, the fin base 10 includes the fins 10b and the reinforced fins 10c of which one side of the ends is bonded to the bottom surface of the heat radiation board 10a. The other ends of the fins 10b, which are separated from the heat radiation board 10a are free ends, and the other ends of the reinforced fins 10c, which are separated from the heat radiation board, are bonded to the water jacket 11.

Conventionally all the other ends of all the fins are free ends, separated from the fin base 10. In this conventional mode, however, if the thickness of the heat radiation board 10a, where one side of the ends of the fins is fixed, is decreased in order to decrease the thermal resistance and to reduce the bonding temperature Tj of the semiconductor elements 4, the fin base 10 easily becomes deformed, and warpage of the entire module tends to increase, whereby the thermal stress more easily concentrates on the solder layer bonding the heat radiation board 10a and the insulated wiring board 1. If the thermal stress concentrates on this solder layer 9, a problem such as cracking of the solder layer 9 occurs, which may lead to a breakdown of the bonding surface.

In the present invention, at least some of the plurality of fins are formed as the reinforced fins 10c by the free ends (the other ends) thereof being bonded to the water jacket 11, whereby warpage of the entire module caused by deformation of the fin base 10 is suppressed, and such a problem as cracking of the solder layer 9 is prevented.

In the present invention, the other ends of all the fins can be bonded and fixed to the water jacket 11 to be the reinforced fins 10c, but in this case, a down side is that the pressure loss increases. Therefore it is preferable that some of the fins are the reinforced fins 10c and the other fins 10b have other ends which are free ends, separated from the heat radiation board 10a.

In the power semiconductor module 100 of the present invention, one side of the ends of the fins 10b and the reinforced fins 10c is bonded to the heat radiation board 10a, and the fins 10b, 10c and the heat radiation board 10a are integrated. Casting, brazing, welding, extrusion processing or the like can be used for this integration. It is also possible to form the fin base 10 by simultaneously forming the convex portions of the fins 10b and 10c (external shapes) with the heat radiation board 10a by die casting or press forging, then finishing the convex portions into desired fin shapes by a machining or a wire cut method. Further, the fins 10b and 10c and the heat radiation board 10a may be integrated by a press forging method alone.

Figure 5:
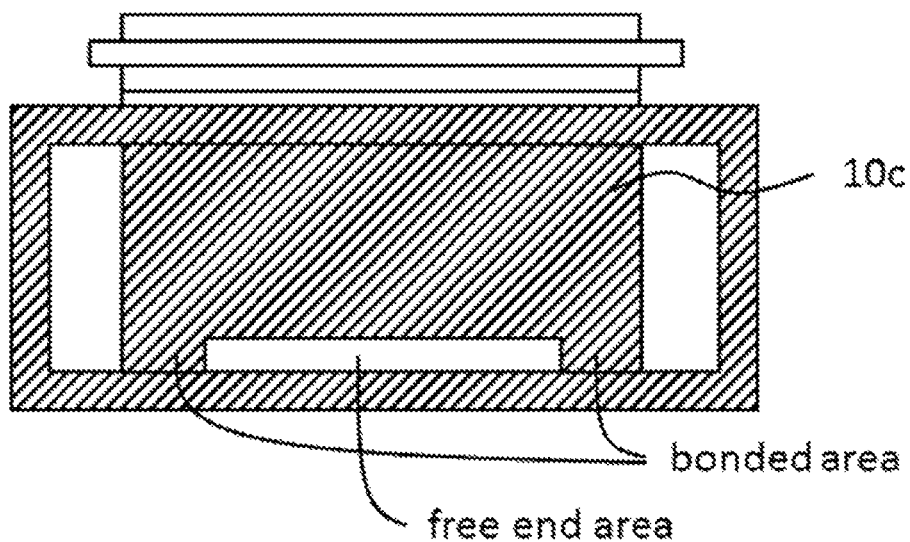
FIG. 5 is a cross-sectional view taken along a line V-V in FIG. 3.

Then, some of the fins located below the insulated wiring board 1 are formed as the reinforced fins 10c by the other ends thereof being bonded to the water jacket 11. As shown in FIG. 5, the other ends of the reinforced fin 10c may have an area bonded to the water jacket 11 and the free end area. For example, the reinforced fin 10c has areas, in the longitudinal ends thereof, bonded to the water jacket 11, and a free end area in the center between the areas bonded to the water jacket. As the free end area becomes wider, the pressure loss decreases when the coolant flow through, hence the load on the pump that delivers coolant can be decreased.

As illustrated in FIG. 1, the water jacket 11 has a concave shape having an opening on the upper side, so as to bond to the bottom surface on the periphery of the heat radiation board 10a, in order to house the fins 10b and the reinforced fins 10c. The water jacket 11 has an introducing port and a discharge port (not illustrated) for the coolant. By coolant flowing in this water jacket 11, the fins 10b and the reinforced fins 10c are cooled by the coolant. The discharged coolant is collected, and after the heat thereof is released to the outside by a heat exchanger (not illustrated), the coolant is guided to the introducing port by a pump (not illustrated) and circulated. The water jacket 11 is preferably formed by a material having high thermal conductivity, just like the heat radiation board 10a, the fins 10b and the reinforced fins 10c, especially by a metal material. For example, the water jacket 11 can be formed using such as metal material as aluminum, aluminum alloy, copper or copper alloy.

Embodiment

A concrete structure of an example of the power semiconductor module 100 of the present invention will be described with reference to FIG. 1 to FIG. 4 and Table 1, along with the effect of the invention. The insulated wiring board 1 illustrated in FIG. 1 includes the insulated thin plate 7, the metal circuit wiring layer 6 on the front surface side of the insulated thin plate 7, and the metal layer 8 on the rear surface side of the insulated thin plate 7. The insulated thin plate 7 is a 0.32 mm thick ceramic board of which main component is silicon nitride. The metal circuit wiring layer 6 on the front surface side and the metal layer 8 on the rear surface side are a 0.4 mm thick copper foil respectively, and are directly bonded to the insulated thin plate 7 in advance by the eutectic reaction between the insulated thin plate 7 and the copper foils. The insulated wiring board 1 and the heat radiation board 10a of the fin base 10 are bonded via a solder layer 9, which was formed with Sn—Sb type solder to be about a 0.45 mm thickness.

The fin base 10 is formed with aluminum material by extrusion molding. The thickness of the heat radiation board 10a is 1 mm, which is thinner than the thickness 2.0 to 5.0 mm of conventional heat radiation boards. The fins 10b and the reinforced fins 10c are formed to have a 0.8 mm thickness. In the case of a conventional fin base where one side of the ends of the fins is bonded to the heat radiation board 10a and the other ends are all free ends, the thickness of the heat radiation board 10a must be at least 1.2 mm, preferably 2 mm or more, otherwise the fin base 10 may be deformed by the stress applied to the heat radiation board 10a. If the fin base 10 is deformed, cracking may be generated in the solder layer 9 that bonds the insulated wiring board 1 and the heat radiation board 10a.

The heat radiation board 10a of the fin base 10 according to the present invention can be thinner then the conventional types because the other ends of the fins are not all free ends, but are formed by both fins 10b having free ends and reinforced fins 10c, of which other ends are bonded to the water jacket 11. Further, a preferable embodiment of the present invention is characterized by locations where the reinforced fins 10c are disposed. In other words, when reference A denotes a length of one side of the insulated wiring board 1, and reference B denotes a distance from the edge of the insulated wiring board 1 to the position of the reinforced fins 10c located inside the insulated wiring board 1, the locations where the reinforced fins 10c are disposed are in the inner direction from the edge of the insulated wiring board 1, such that B/A is 20% or less and preferably 15% or less. The reason why the reinforced fins 10c are arranged in this way will now be described, including the experimental result based on simulation.

It is preferable that the heat radiation board 10a, the fins 10b, the reinforced fins 10c and the water jacket 11 are formed from materials having high conductivity, particularly by metal materials. For example, such metal materials as aluminum, aluminum alloy, copper and copper alloy can be used. Using aluminum or aluminum alloy is even more preferable. The heat radiation board 10a, the fins 10b, the reinforced fins 10c and the water jacket 11 may be formed from homogeneous metal materials or heterogeneous metal materials. If homogeneous materials are used, manufacturing becomes easier.

For a power semiconductor module having the structure with the arrangement of the reinforced fins 10c according to the above mentioned characteristics of the present invention, and a power semiconductor module having the structure with no reinforced fins 10c, the relationship of the plastic strain amplitude generated in the solder layer 9 during thermal cycling and the warpage of the module after soldering was examined based on thermal stress simulation.

Here a known formula on plastic strain amplitude will be described. Normally the low cycle fatigue life of solder follows the Manson-Coffin law shown in the following expression.

$\Delta\epsilon_p N_f^b = C$ ($\Delta\epsilon_p$: plastic strain amplitude; $N_f$: fatigue life; b and c: constants depending on the material)

Therefore, in order to extend the fatigue life, the plastic strain amplitude must be decreased according to the Manson-Coffin law.

Table 1 shows a list of data used for the thermal stress simulation and the acquired results for the experimental examples of the power semiconductor module of the present invention and the comparative experiment examples.

TABLE 1

|  | Size A of insulated wiring board (mm) | Horizontal distance B from edge of insulated wiring board to reinforced fins (mm) | Size A/ horizontal distance B (%) | Plastic strain amplitude (%) | Ratio of plastic strain amplitude to comparative example 1 (%) | Warpage (mm) | Ratio of warpage to comparative example 1 (%) |
|---|---|---|---|---|---|---|---|
| Comparative experimental example 1 | 43.6 | — | — | 1.87 | 100 | 1.05 | 100 |
| Comparative experimental example 2 | 43.6 | −3.2 | −7.3 | 1.94 | 104 | 0.88 | 84 |
| Comparative experimental example 3 | 43.6 | −0.8 | −1.7 | 1.89 | 101 | 0.75 | 71 |
| Experimental example 1 | 43.6 | 0.2 | 0.3 | 1.63 | 87 | 0.51 | 49 |
| Experimental example 2 | 43.6 | 2.3 | 5.2 | 1.58 | 84 | 0.41 | 39 |
| Experimental example 3 | 43.6 | 6.5 | 14.8 | 1.66 | 89 | 0.43 | 41 |
| Comparative experimental example 4 | 43.6 | 21.8 | 50.0 | 1.86 | 99 | 0.69 | 66 |

Figure 2:
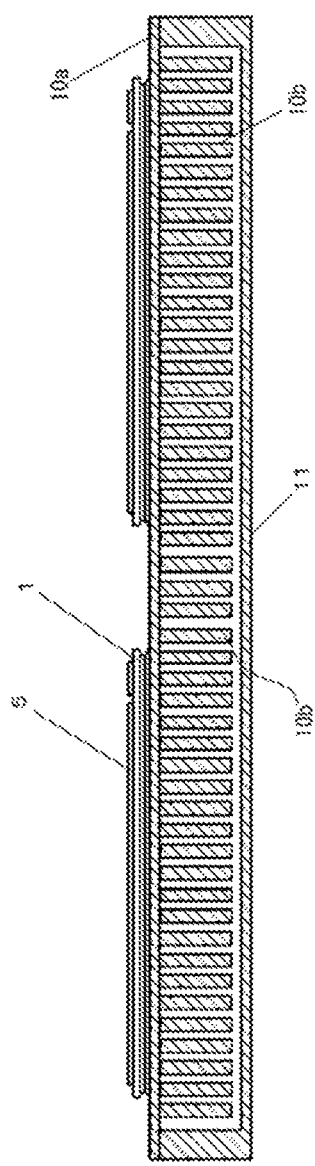
FIG. 2 is a cross-sectional view of a conventional power semiconductor module according to a comparative experimental example 1.

In Table 1, the comparative experimental example 1 is a case when the other ends of all the fins 10b are free ends. FIG. 2 is a cross-sectional view of a power semiconductor module according to the comparative experimental example 1. The difference of FIG. 2 from the cross-sectional view of the power semiconductor module in FIG. 1 is that the other ends of the fins 10b of the fin base 10 are all free ends, and are not fixed. The dimensions or the like of FIG. 1 and FIG. 2 appear to be different because scale is different, but the power semiconductor module in FIG. 1 and that in FIG. 2 are the same except for the above mentioned aspect. In FIG. 2, the resin case 2 and the bonding wires 3 are omitted to simplify the drawing.

Figure 3:
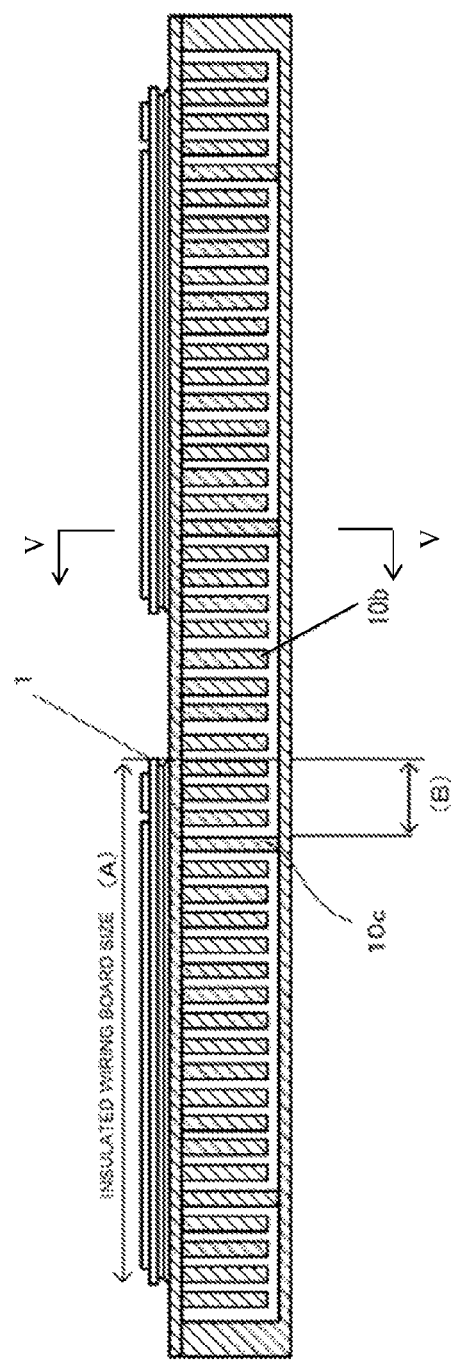
FIG. 3 is a cross-sectional view of the power semiconductor module according to an embodiment of the present invention to show the size A of the insulated wiring board, and the distance B from the edge of the insulated wiring board to the reinforced fin.

FIG. 3 is a cross-sectional view of the power semiconductor module of the present invention used for the experimental examples 1 to 3. The dimensional scale of FIG. 3 is different from the schematic cross-sectional view of FIG. 1, but both are cross-sectional views of the same power semiconductor module of the present invention. The power semiconductor module in FIG. 3 is characterized in that some of the fins are formed as the reinforced fins 10c by the other ends thereof being bonded to the water jacket 11.

The experimental examples 1 to 3 and the comparative experimental example 4 in Table 1 are different in distance B from the edge of the insulated wiring board 1 to the reinforced fins 10c. The experimental examples 1 to 3 are examples when the effect of the present invention is demonstrated more clearly. The reinforced fins 10c in the experimental examples 1 to 3 are located below the insulated wiring board 1 at positions where the ratio of the distance B to the length A of one side of the insulated wiring board is B/A=20% or less.

In the comparative experimental example 4, on the other hand, the positions of the reinforced fins 10c are below the insulated wiring board 1, but the ratio B/A thereof is 50%, exceeding 20%.

The comparative experimental example 1 in Table 1 is an example when all the fins are the fins 10b having free ends, and no reinforced fins 10c exist, as illustrated in FIG. 2.

In the comparative experimental examples 2 and 3 (not illustrated) in Table 1, on the other hand, the positions of the reinforced fins 10c are different from the experimental examples 1 to 3 and the comparative experimental example 4, and the reinforced fins 10c are not located below the insulated wiring board 1, but in a position distant from the area below the insulated wiring board 1. In Table 1 and FIG. 4, this distance B from the edge of the insulated wiring board 1 and the ratio B/A are indicated with a minus (−) sign.

Figure 4:
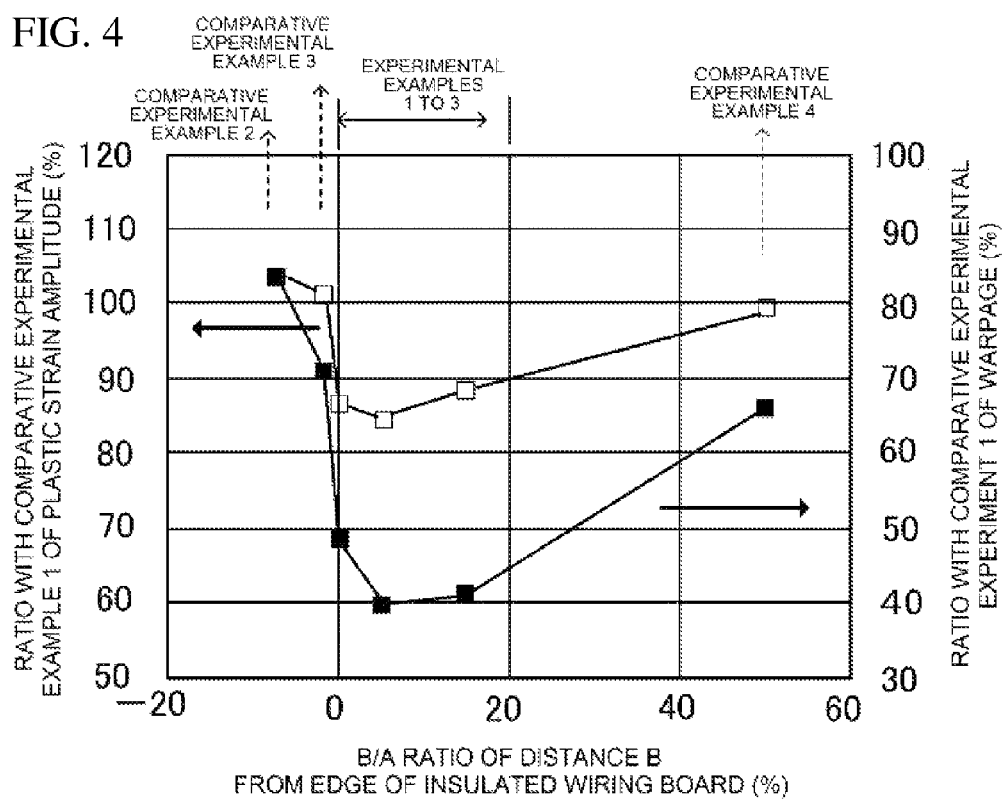
FIG. 4 is a relational diagram, based on thermal stress simulation, of B/A ratio (%), ratio (%) of warpage compared with a comparative experimental example 1, and ratio (%) of plastic strain amplitude compared with comparative experimental example 1, regarding experimental examples 1 to 3 including an embodiment of the present invention and comparative experimental examples 1 to 4.

FIG. 4 is a graph that is created based on the values in Table 1, and is a relational diagram of the distance from the edge of the insulated wiring board 1 to the reinforced fins 10c bonded to the water jacket 11, warpage and plastic strain amplitude. The abscissa of FIG. 4 indicates a ratio B/A (%) of the distance from the edge of the insulated wiring board 1 to the reinforced fins 10c bonded to the water jacket 11 when the length of one side of the insulated wiring board 1 is assumed to be 100%. The first ordinate (left side) indicates a ratio of the plastic strain amplitude (%) when the plastic strain amplitude of the structure, where other ends of all the fins are not bonded to the water jacket (comparative experiment example 1), is assumed to be 100%. The second ordinate (right side) indicates a ratio of the warpage (%) when the warpage of the comparative experimental example 1 is assumed to be 100%.

In each of the experimental examples 1 to 3 and the comparative experimental examples 2 to 4, □ indicates the ratio of the plastic strain amplitude, and ■ indicates the ratio of the warpage.

As shown in FIG. 4, in the experimental examples 1 to 3, compared with the comparative experimental example 1 (100%), the plastic strain amplitude decreases to about 84% to 89%, and the warpage decreases to 39% to 49%.

In the comparative experimental example 4, the warpage is somewhat smaller (66%) compared with the comparative experimental example 1, but the plastic strain amplitude is almost the same (99%).

The comparative experimental examples 2 and 3 are shown in the area where the distance B is at the left side (−) from 0 in the abscissa of the graph. The ratios of the plastic strain amplitude of the comparative experimental examples 2 and 3 are 104% and 101%, and the ratios of the warpage thereof are 84% and 71%, with respect to the comparative experimental example 1 (100%), that is, warpage is somewhat smaller, but the plastic strain amplitude is almost the same or somewhat higher.

As described above, as shown in FIG. 4, the plastic strain amplitude is decreased by 10% or more and the warpage is decreased by 50% or more, compared with the comparative experimental examples, in the range where the distance from the edge of the insulated wiring board 1 to the reinforced fins 10c is 0% to 20% of the length of one side of the insulated wiring board 1, demonstrating a good result.

In the case of the comparative experimental examples 2, 3 and 4 as well, the warpage is decreased compared to the comparative experimental example 1 in which reinforced fins are not created, and the effect of the present invention can be demonstrated to a certain degree.

In the experimental examples 1 to 3 and the comparative experimental examples 2 to 4, a pair of reinforced fins 10c is disposed respectively near the mutually opposite sides of the insulated wiring board 1. Thus according to the present invention, it is preferable that at least a pair of reinforced fins 10c is disposed near mutually opposite sides of the insulated wiring board 1 respectively.

According to the power semiconductor module of the example described above, a power semiconductor module that includes a fin-integrated direct water cooling structure can be provided, whereby even if the thickness of the heat radiation board bonded under the insulated wiring board is decreased, stress that concentrates on the solder layer bonding the insulated wiring board and the heat radiation board is relaxed, and cracking is hardly generated in the solder layer.

EXPLANATION OF REFERENCE NUMERALS 1 insulated wiring board
2 case
3 bonding wire
4 semiconductor element
5 solder layer
6 metal circuit wiring layer
7 insulated thin plate
8 metal layer
9 solder layer
10 fin base
10a heat radiation board
10b fin
10c reinforced fin
11 water jacket
12 lead out electrode terminal
100 power semiconductor module

What is claimed is:
1. A power semiconductor module, comprising:
an insulated wiring board;
a semiconductor element mounted on one main surface of the insulated wiring board;
a heat radiation board bonded to another main surface of the insulated wiring board;
a plurality of fins including first fins each having one end fixed to the another main surface of the heat radiation board and another end with a free end; and
a water jacket housing the plurality of fins and allowing coolant to flow through the plurality of fins,
wherein the plurality of fins further includes at least one pair of second fins as reinforced fins each having one end fixed to the another main surface of the heat radiation board and another end bonded to the water jacket, and
wherein the at least one pair of second fins is located below the insulated wiring board, one of the at least one pair of second fins being disposed at a position from one edge of the insulated wiring board to an inner side of the insulated wiring board and another of the at least one pair of second fins being disposed at a position from another edge of the insulated wiring board to the inner side of the insulated wiring board, each of the at least one pair of second fins being located at a ratio B/A of 20% or less, in which A denotes a length of the insulated wiring board, and B denotes a distance from the one edge of the insulated wiring board to the one of the at least one pair of second fins or from the another edge of the insulated wiring board to the another of the at least one pair of the reinforced fins.

2. The power semiconductor module according to claim 1, wherein the insulated wiring board includes:
   an insulated thin plate;
   a metal circuit wiring layer bonded to one main surface of the insulated thin plate; and
   a metal layer bonded to another main surface of the insulated thin plate.

3. The power semiconductor module according to claim 1, wherein the another ends of the reinforced fins each include an area bonded to the water jacket and a free end area.

4. The power semiconductor module according to claim 1, wherein the at least one pair of second fins is spaced from side surfaces of the water jacket.

5. The power semiconductor module according to claim 1, wherein the plurality of fins including the first fins and the second fins has a same lateral size while the first fins have the free ends and the second fins are connected to the water jacket.

\* \* \* \* \*